(12) United States Patent
Wu et al.

(10) Patent No.: US 11,289,598 B2
(45) Date of Patent: Mar. 29, 2022

(54) CO-INTEGRATED HIGH VOLTAGE (HV) AND MEDIUM VOLTAGE (MV) FIELD EFFECT TRANSISTORS

(71) Applicant: GLOBALFOUNDRIES Dresden Module One Limited Liability Company & Co. KG, Dresden (DE)

(72) Inventors: Nan Wu, Dresden (DE); Thorsten E. Kammler, Dresden (DE); Peter Baars, Dresden (DE)

(73) Assignee: GLOBALFOUNDRIES DRESDEN MODULE ONE LIMITED LIABILITY COMPANY & CO. KG, Dresden (DE)

( * ) Notice: Subject to any disclaimer, the term of this patent is extended or adjusted under 35 U.S.C. 154(b) by 0 days.

(21) Appl. No.: 16/849,560

(22) Filed: Apr. 15, 2020

(65) Prior Publication Data
US 2021/0328055 A1 Oct. 21, 2021

(51) Int. Cl.
| | | |
|---|---|---|
| H01L 29/78 | (2006.01) |
| H01L 27/12 | (2006.01) |
| H01L 27/088 | (2006.01) |
| H01L 29/06 | (2006.01) |
| H01L 29/66 | (2006.01) |

(52) U.S. Cl.
CPC ........ *H01L 29/7824* (2013.01); *H01L 27/088* (2013.01); *H01L 27/1207* (2013.01); *H01L 29/0653* (2013.01); *H01L 29/66659* (2013.01); *H01L 29/7835* (2013.01)

(58) Field of Classification Search
CPC ... H01L 27/00; H01L 27/0218; H01L 27/105; H01L 27/0705; H01L 27/0251; H01L 27/085; H01L 27/092; H01L 27/1207; H01L 27/088; H01L 29/7824; H01L 29/7835; H01L 29/66659; H01L 29/0653
See application file for complete search history.

(56) References Cited

U.S. PATENT DOCUMENTS

| | | |
|---|---|---|
| 7,105,897 B2 | 9/2006 | Chen et al. |
| 7,118,986 B2 | 10/2006 | Steigerwalt et al. |

(Continued)

FOREIGN PATENT DOCUMENTS

| | | |
|---|---|---|
| TW | 201812855 | 4/2018 |

OTHER PUBLICATIONS

Specification and drawings in U.S. Appl. No. 17/091,382, filed Nov. 6, 2020, 30 pages.

(Continued)

*Primary Examiner* — Galina G Yushina
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to co-integrated high voltage and medium voltage devices and methods of manufacture. The structure includes a substrate having a semiconductor on insulator (SOI) region and a bulk region; and a first device formed on the bulk region, the first device having a first gate dielectric layer and a second gate dielectric layer surrounding the first dielectric layer, and a thickness of the first gate dielectric layer and the second gate dielectric layer being greater than a thickness of an insulator layer of the SOI region.

17 Claims, 5 Drawing Sheets

(56) References Cited

U.S. PATENT DOCUMENTS

| | | | |
|---|---|---|---|
| 7,799,645 B2* | 9/2010 | Choi | H01L 27/11568 |
| | | | 438/278 |
| 8,012,814 B2 | 9/2011 | Ding et al. | |
| 8,222,712 B2 | 7/2012 | Kato et al. | |
| 8,525,273 B2 | 9/2013 | Kwon et al. | |
| 8,652,888 B2 | 2/2014 | Cheng et al. | |
| 8,809,990 B2* | 8/2014 | Maeda | H01L 21/823462 |
| | | | 257/500 |
| 10,283,622 B1 | 5/2019 | Zhang | |
| 10,504,889 B1 | 12/2019 | Anderson | |
| 10,504,932 B2 | 12/2019 | Oh et al. | |
| 2009/0096036 A1* | 4/2009 | Ishigaki | H01L 21/823481 |
| | | | 257/392 |
| 2011/0136306 A1* | 6/2011 | Ariyoshi | H01L 21/823857 |
| | | | 438/227 |
| 2013/0175590 A1* | 7/2013 | Kim | H01L 27/0629 |
| | | | 257/296 |
| 2015/0187903 A1* | 7/2015 | Niimi | H01L 21/31053 |
| | | | 257/401 |
| 2015/0364490 A1* | 12/2015 | Oda | H01L 27/1203 |
| | | | 257/351 |
| 2017/0170178 A1* | 6/2017 | Cheng | H01L 21/0262 |
| 2018/0053832 A1 | 2/2018 | Beyer | |
| 2018/0061839 A1 | 3/2018 | Baars | |
| 2019/0035815 A1* | 1/2019 | Smith | H01L 21/823857 |
| 2020/0294978 A1* | 9/2020 | Go | H01L 21/76898 |

OTHER PUBLICATIONS

Taiwanese Office Action in related TW Application No. 110109064 dated Nov. 3, 2022, 12 pages.

\* cited by examiner

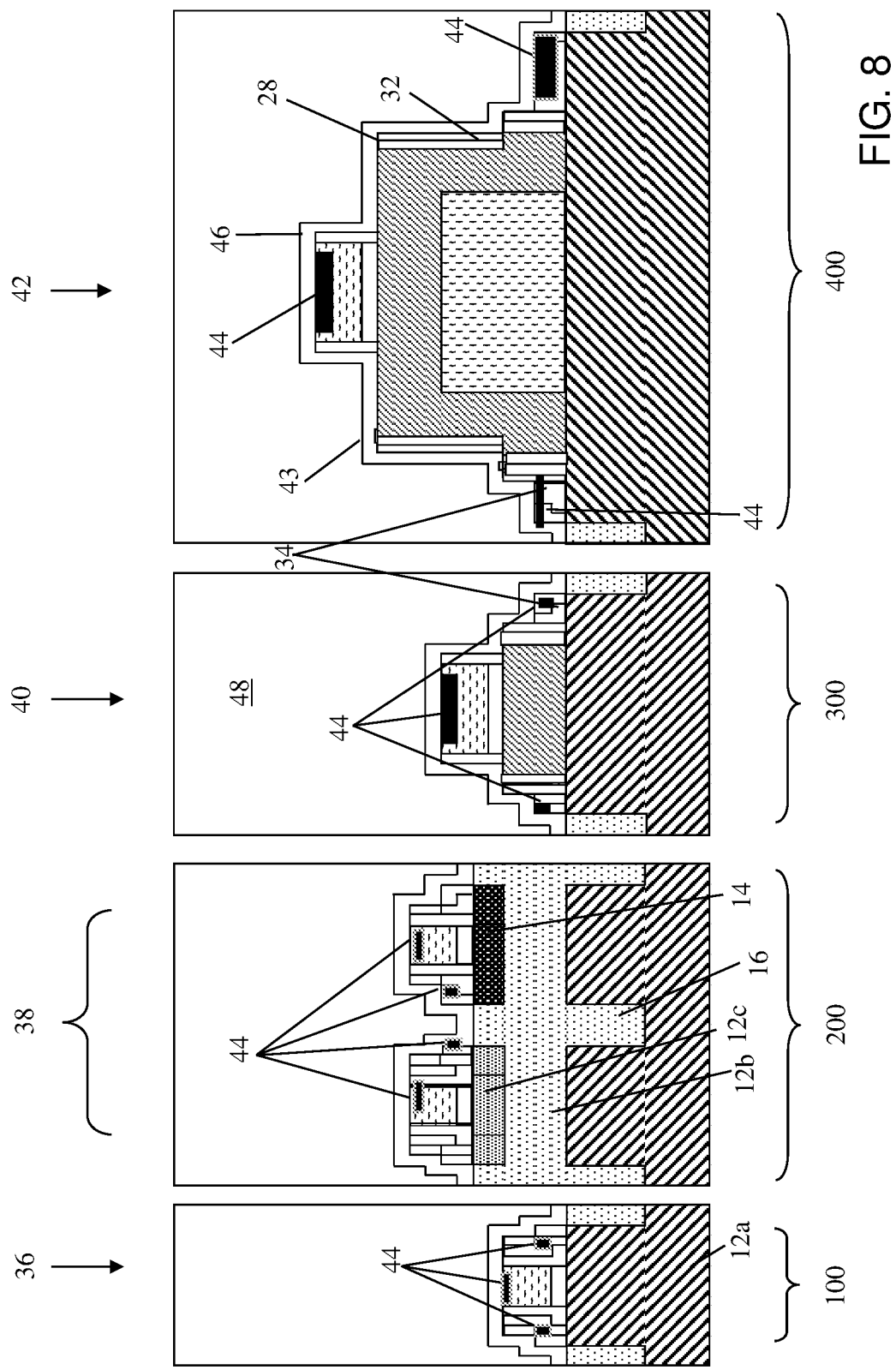

US 11,289,598 B2

CO-INTEGRATED HIGH VOLTAGE (HV) AND MEDIUM VOLTAGE (MV) FIELD EFFECT TRANSISTORS

FIELD OF THE INVENTION

The present disclosure relates to semiconductor structures and, more particularly, to co-integrated high voltage and medium voltage devices and methods of manufacture.

BACKGROUND

Silicon-on-insulator (SOI) substrates including fully depleted SOI (FDSOI) or radio frequency SOI (RFSOI) are used for various integrated circuit (IC) applications. The SOI substrates include a thin surface crystalline or silicon layer separated from the bulk substrate by a buried oxide (BOX).

Typically, IC applications include high voltage (HV) transistors, such as extended drain metal oxide semiconductor (EDMOS) transistors. However, the thin surface substrate of SOI substrates are not amenable to accommodate HV transistors, such as EDMOS. This results in difficulties in integrating HV transistors on SOI substrates with other devices. For example, conventional techniques for integrating HV transistors on SOI substrates require complex processing to make them compatible with other devices. These complex processing, though, results in increased cost.

SUMMARY

In an aspect of the disclosure, a structure comprises: a substrate having a semiconductor on insulator (SOI) region and a bulk region; and a first device formed on the bulk region, the first device having a first gate dielectric layer and a second gate dielectric layer surrounding the first dielectric layer, and a thickness of the first gate dielectric layer and the second gate dielectric layer being equal to or greater than a thickness of an insulator layer of the SOI region.

In an aspect of the disclosure, structure comprises: a substrate having a semiconductor on insulator (SOI) region and a bulk region; a first device formed on the bulk region, the first device having a first gate dielectric layer and a second gate dielectric layer surrounding the first dielectric layer; and a second device formed on the bulk region, the second device having the second gate dielectric layer with a same thickness as the second gate dielectric layer for the first device. The first device and the second device are of different absolute heights.

In an aspect of the disclosure, a structure comprises: a substrate having a semiconductor on insulator (SOI) region and a bulk region; a first device formed on the bulk region, the first device having a first gate dielectric layer and a second gate dielectric layer surrounding the first dielectric layer; a second device formed on the bulk region, the second device having the second gate dielectric material; and at least a third device formed on the SOI region, which is devoid of the first gate dielectric material and the second gate dielectric material. The first device, the second device and the at least third device each have source and drain regions which are partially silicided on a side surface thereof.

BRIEF DESCRIPTION OF THE DRAWINGS

The present disclosure is described in the detailed description which follows, in reference to the noted plurality of drawings by way of non-limiting examples of exemplary embodiments of the present disclosure.

FIG. 8 shows different devices with partially silicided raised source and drain regions on the SOI technology and bulk technology, amongst other features, and respective fabrication processes in accordance with aspects of the present disclosure.

DETAILED DESCRIPTION

The present disclosure relates to semiconductor structures and, more particularly, to co-integrated high voltage (HV) and medium voltage (MV) devices and methods of manufacture. More specifically, the present disclosure relates to the co-integration of HV and MV field effect transistors (FETs) with fully depleted semiconductor on insulator (FDSOI) technologies and related devices. Advantageously, the present disclosure provides a full integration scheme of devices needed for display driver integrated circuits (DDIC), while also maintaining low-power FDSOI platform device performance. Moreover, the integration of HV and MV FETs into FDSOI technology nodes allows for the migration of applications and/or circuits from older technologies into more current technology nodes.

In embodiments, the HV FET and MV FET can be integrated on a same die (in bulk technology) with fully depleted MOSFET devices. More specifically, the HV and MV FETs, for example, can be integrated on both bulk technologies with SOI technologies. In an example of this integration scheme, the HV FET comprises a first gate dielectric layer and a second gate dielectric layer. The second gate dielectric layer will also be used for the MV FET. The second gate dielectric layer surrounds top and side surfaces of the first gate dielectric layer, with a total thickness of the first gate dielectric layer and the second gate dielectric layer being equal to or greater than a thickness of the insulator layer (e.g., buried oxide) of the SOI technology. For example, the thickness of the dielectric layers may be, e.g. 3X greater thickness than the insulator layer.

In further embodiments, the thickness of the gate dielectric of the HV FET is greater than the thickness of the gate dielectric of the MV FET. In another example, the channel surface of the MV and HV FETs (e.g., MOSFET) is aligned to the bottom of the insulator layer, e.g., BOX, of the SOI technology. Also, the gate dielectric layer of the MV FET may be about the same thickness of the insulator layer (e.g., buried oxide) of the SOI technology.

The devices of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the devices use three basic building blocks: (i) deposition of thin films of material on a substrate, (ii) applying a patterned mask on top of the films by photolithographic imaging, and (iii) etching the films selectively to the mask.

Figure 1:
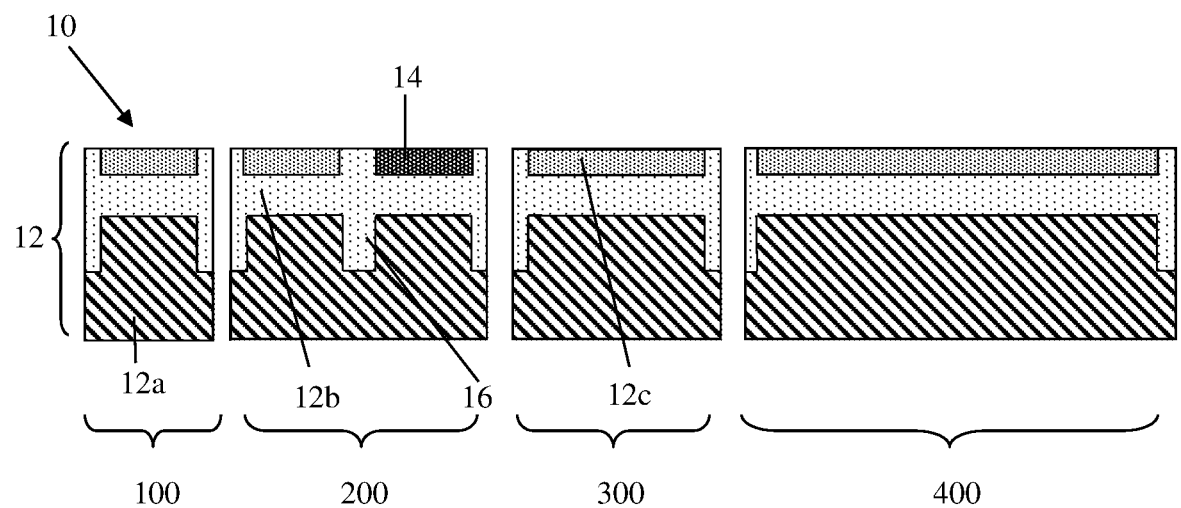
FIG. 1 shows a substrate, amongst other features, and respective fabrication processes in accordance with aspects of the present disclosure.

FIG. 1 shows a substrate, amongst other features, and respective fabrication processes in accordance with aspects of the present disclosure. More specifically, the structure 10 of FIG. 1 includes a substrate 12 comprising SOI technology. The substrate 12 can be a fully depleted p-doped substrate, as an example. In embodiments, the substrate 12 includes four separate regions for illustrative purposes: (i) region 100 used for hybrid devices; (ii) region 200 used for SOI/cSiGe devices; (iii) region 300 used for MV FET devices; and (iv) region 400 used for HV FET devices. As further described below, the substrate 12 for regions 100, 300 and 400 will be modified into a bulk wafer implementation. In embodiments, and as an illustrative and non-limiting example, the MV FET device can be an 8V FET; whereas, the HV FET device can be a 20V FET.

In the SOI technology, the substrate 12 includes a semiconductor material 12c bonded or attached to an insulating layer 12b, and the insulator layer 12b is bonded to a bulk wafer 12a, e.g., bulk semiconductor material. The semiconducting material 12c can be bonded to the insulating layer 12b by using wafer bonding techniques and/or other suitable methods. The insulator layer 12b is also formed by any suitable process, such as separation by implantation of oxygen (SIMOX), oxidation, deposition, and/or other suitable process. The semiconductor materials 12a, 12c may comprise any suitable semiconductor material, e.g., Si, SiGeC, SiC, GaAs, InAs, InP, and other III/V or II/VI compound semiconductors. The insulator layer 12b also comprises any suitable material, including silicon oxide, sapphire, other suitable insulating materials, and/or combinations thereof. An exemplary insulator layer 12b is a buried oxide layer (BOX) with a thickness of about 10-30 nm.

Still referring to FIG. 1, in region 200, a portion of the semiconductor material 12c is subject to a condensation process to form a channel region 14 of different semiconductor material. For example, the channel region 14 can be SiGe created by SiGe condensation processes. The condensation process can be any condensation process as is known in the art. For example, germanium condensation can be demonstrated using a one-step or two-step wet oxidation of germanium implanted into the semiconductor material 12c. And, as should be understood by those of skill in the art, Ge diffusion and accumulation will vary with gas flow and temperature. In embodiments, the SiGe channel region 14 is used for pFET devices (e.g., cSiGe).

FIG. 1 further shows a plurality of shallow trench isolation structures 16. In embodiments, the shallow trench isolation structures 16 are formed by conventional lithography, etching and deposition methods known to those of skill in the art. For example, a resist formed over the semiconductor material 12c is exposed to energy (light) to form a pattern (opening). An etching process with a selective chemistry, e.g., reactive ion etching (RIE), will be used to form one or more trenches in the substrate 12 through the openings of the resist, extending into the bulk semiconductor material 12a. Following the resist removal by a conventional oxygen ashing process or other known stripants, insulator material, e.g., oxide, can be deposited by any conventional deposition processes, e.g., chemical vapor deposition (CVD) processes. Any residual material on the surface of the semiconductor material 12c, 14 can be removed by conventional chemical mechanical polishing (CMP) processes.

As should be further understood, the substrate 12 can be subjected to an ion implantation process to form wells, particularly in regions 300 and 400. For example, region 300 for the MV FET device can be subjected to an ion implantation process for creating an N-well; whereas, region 400 for the HV FET device can be subjected to an ion implantation process for creating both an N-well and a P-well. For example, the P-well is doped or implanted with p-type dopants, e.g., Boron (B), and the N-well is doped or implanted with n-type dopants, e.g., Arsenic (As), Phosphorus (P) and Sb, among other suitable examples.

In embodiments, the wells may be formed by introducing a concentration of a different dopant of opposite conductivity type in the substrate 12. In embodiments, respective patterned implantation masks may be used to define selected areas exposed for the implantations. The implantation mask used to select the exposed area for forming the wells is stripped after implantation, and before the implantation mask used to form other wells of a different type. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. Following the implantation process, an anneal can be performed to drive in the dopants, as is understood by those of skill in the art.

Figure 2:
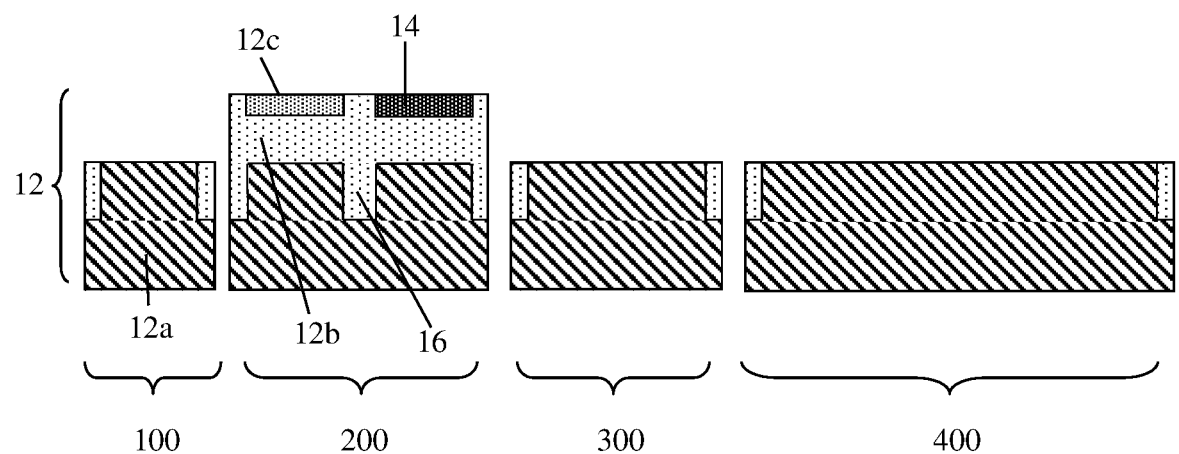
FIG. 2 shows SOI technology and bulk technology from the same substrate, amongst other features, and respective fabrication processes in accordance with aspects of the present disclosure.

In FIG. 2, the substrate 12 is subjected to an etching process to form a bulk semiconductor implementation in regions 100, 300, and 400. For example, after the implantation masks (and/or other masks) are removed, a lithography and etching process is performed on the substrate 12 to remove the semiconductor material 12c and insulator layer 12b in regions 100, 300 and 400. These processes will expose the bulk semiconductor material 12a, creating a bulk implementation for hybrid devices, MV FETs and HV FETs. More specifically, a resist formed over the semiconductor material 12c is exposed to energy (light) to form a pattern (opening) over regions 100, 300 and 400. An etching process with a selective chemistry, e.g., RIE, will be used to remove the semiconductor material 12c and the insulator layer 12b in regions 100, 300 and 400, while protecting region 200 (including the channel region 14), thereby exposing the bulk semiconductor material 12a in regions 100, 300 and 400. In this way, devices in regions 100, 300 and 400 can be fabricated in a bulk implementation, whereas, devices in region 200 can be fabricated using SOI technologies. The resist can be removed by a conventional oxygen ashing process or other known stripants.

Figure 3:
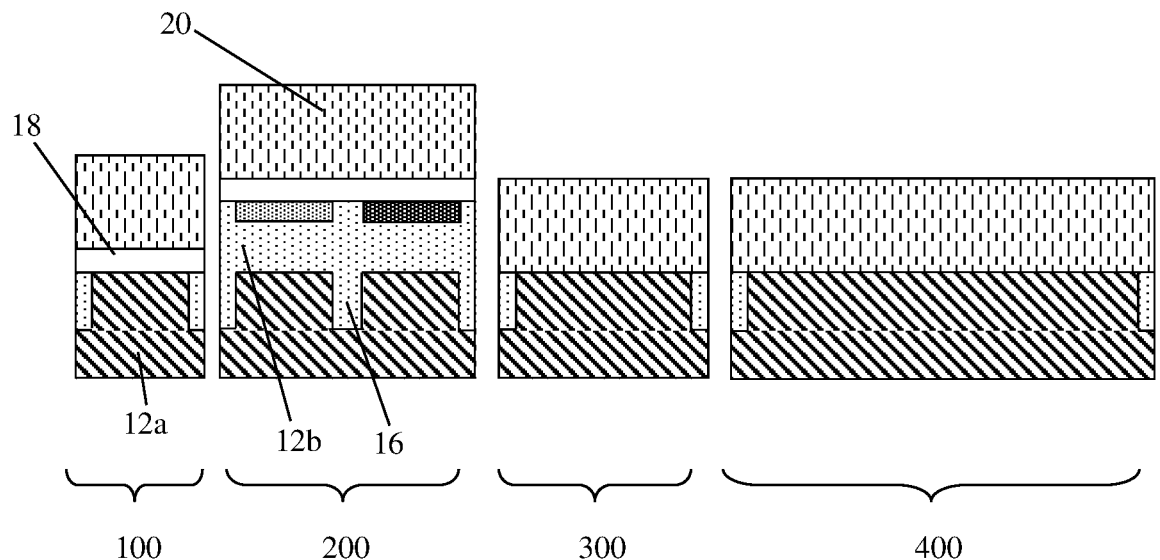
FIG. 3 shows a first gate dielectric material on the substrate, amongst other features, and respective fabrication processes in accordance with aspects of the present disclosure.

Following the etching processes, channel and extension region implants can be fabricated in regions 300 and 400. During the channel and extension region implants, the regions 100 and 200 can be protected by a hardmask and/or stacks of resist materials. In this way, the regions 100 and 200 will not be subject to the implant processes. Following the implantation process, the stacks of resist materials can be removed as is known in the art. The regions 300 and 400 can also be cleaned of any masking material to expose the surface of the bulk semiconductor material 12a. As shown in FIG. 3, though, a hardmask 18 will remain on the semiconductor materials 12c, 14 in regions 100 and 200 during the cleaning process.

In FIG. 3, an insulator material 20 is formed over the bulk semiconductor material 12a in regions 300 and 400, and over the hardmask 18 in regions 100 and 200. Prior to the deposition of the insulator material 20, the exposed surface of the semiconductor material 12c can be cleaned by, e.g., wet processes such as HF chemistries known to those of skill in the art. The hardmask 18 will protect surfaces of regions 100 and 200 during the cleaning process. In embodiments, the insulator material 20 can be a gate oxide material for the HV FET device, e.g., region 400.

The insulator material 20 can be deposited by any conventional deposition method for gate oxides, e.g., CVD, plasma vapor deposition (PVD), etc. Following the deposition process, the insulator material 20 can be subjected to a rapid thermal anneal process as is known in the art. In embodiments, the bottom surface of the insulator material 20 is aligned with the bottom surface of the insulator layer 12b. The insulator material 20 can be deposited to a thickness of about 450 Å; although other dimensions are contemplated herein. In preferred embodiments, the insulator material 20 is deposited to a thickness greater than the thickness of the insulator layer 12b.

Figure 4:
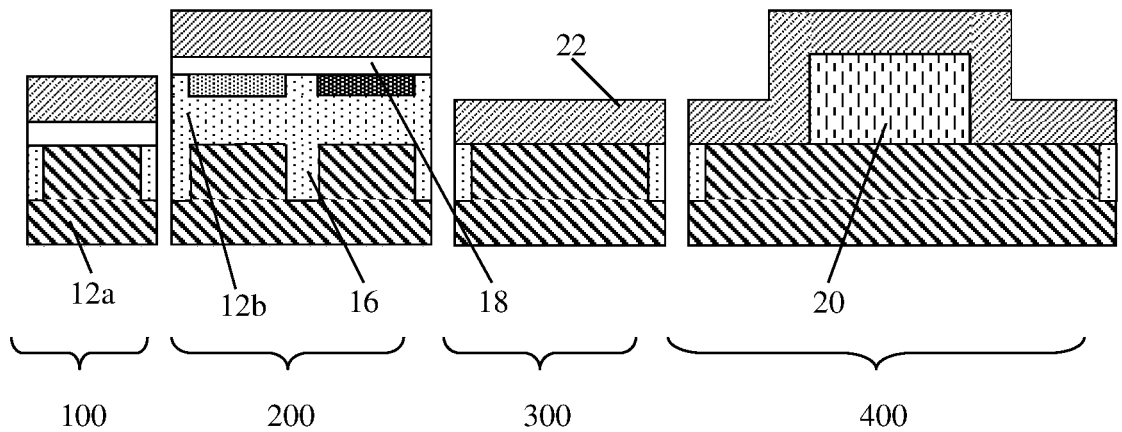
FIG. 4 shows a second gate dielectric material on a patterned first gate dielectric material and the bulk technology, amongst other features, and respective fabrication processes in accordance with aspects of the present disclosure.

In FIG. 4, the insulator material 20 undergoes a patterning process, followed by a deposition of insulator material 22 for the MV FET device, e.g., in region 300. More specifically, as shown in FIG. 4, the insulator material 20 is removed from regions 100, 200, and 300 by conventional lithography and etching processes, e.g., dry and wet etching processes. The insulator material 20 is also partially removed from region 400, leaving patterned insulator material 20 for a HV FET device. Following resist removal, the exposed surfaces can be cleaned by HF solvents, as an example, with the hardmask 18 serving as a HF etch stop layer.

After the cleaning process, insulator material 22 is deposited on the exposed surfaces of the insulator material 20 in region 400, the exposed surface of the bulk semiconductor material 12a in regions 300 and 400, and over the hardmask material 18 in regions 100 and 200. In embodiments, the insulator material 22 will surround the top and side surfaces of the insulator material 20 in the region 400 for the HV FET device. Moreover, the bottom surfaces of both the insulator material 22 and the insulator material 20 will be aligned with the insulator layer 12b, e.g., buried oxide layer of the SOI technology. In embodiments, the insulator material 22 is a gate oxide material for the MV FET device in region 300.

The combination of the insulator material 22 and the insulator material 20 in region 400 will be thicker than the insulator layer 12b, e.g., buried oxide layer of the SOI technology. For example, the insulator material 22 can have a thickness of about 165 Å; although other dimensions are contemplated herein. The insulator material 22 can be deposited by any conventional deposition method for gate oxides, e.g., CVD, PVD, etc., followed by a rapid thermal anneal process as is known in the art.

Figure 5:
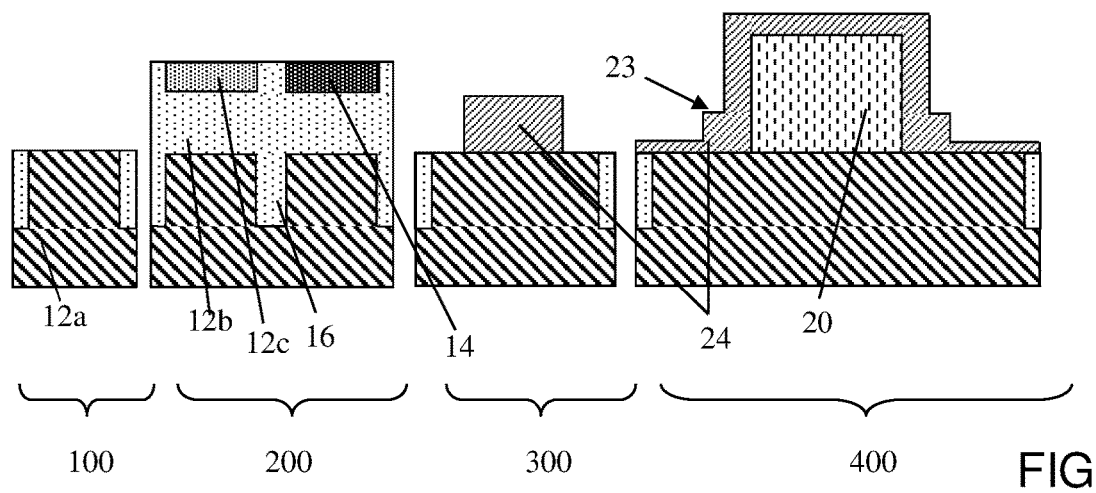
FIG. 5 shows a patterned second dielectric material, amongst other features, and respective fabrication processes in accordance with aspects of the present disclosure.

In FIG. 5, the insulator material 22 undergoes a patterning process for the MV FET device, e.g., in region 300, followed by removal of the hardmask in regions 100 and 200. More specifically, as shown in FIG. 5, the insulator material 22 is completely removed from regions 100 and 200, while being patterned in regions 300 and 400 by use of conventional lithography and etching processes, e.g., dry and wet etching processes. As should be understood by those of skill in the art, the pattern of insulator materials 20, 22 in regions 300 and 400 are a result of the pattern of resist material, i.e., preventing the removal of the insulator materials 20, 22 in regions 300 and 400.

In region 300, the insulator material 22 is partially removed, leaving insulator material 22 for a MV FET device. Also, in region 400, the insulator material 22 will remain on the sides and top surface of the insulator material 20 for the HV FET device. It should be understood that due to the resist pattern, the insulator material 22 for the HV FET device in region 400 will form a stepped feature or pattern 23, and will also remain on portions of the exposed surface of the bulk semiconductor material 12a.

FIG. 5 further shows the removal of the hardmask 18 in regions 100 and 200. The hardmask 18 can be removed. Also, in embodiments, the exposed surfaces, e.g., semiconductor materials 12c, 14 can undergo a preclean process with resist strip, as an example, to remove any native oxide on the surfaces of the semiconductor materials 12c, 14.

Figure 6:
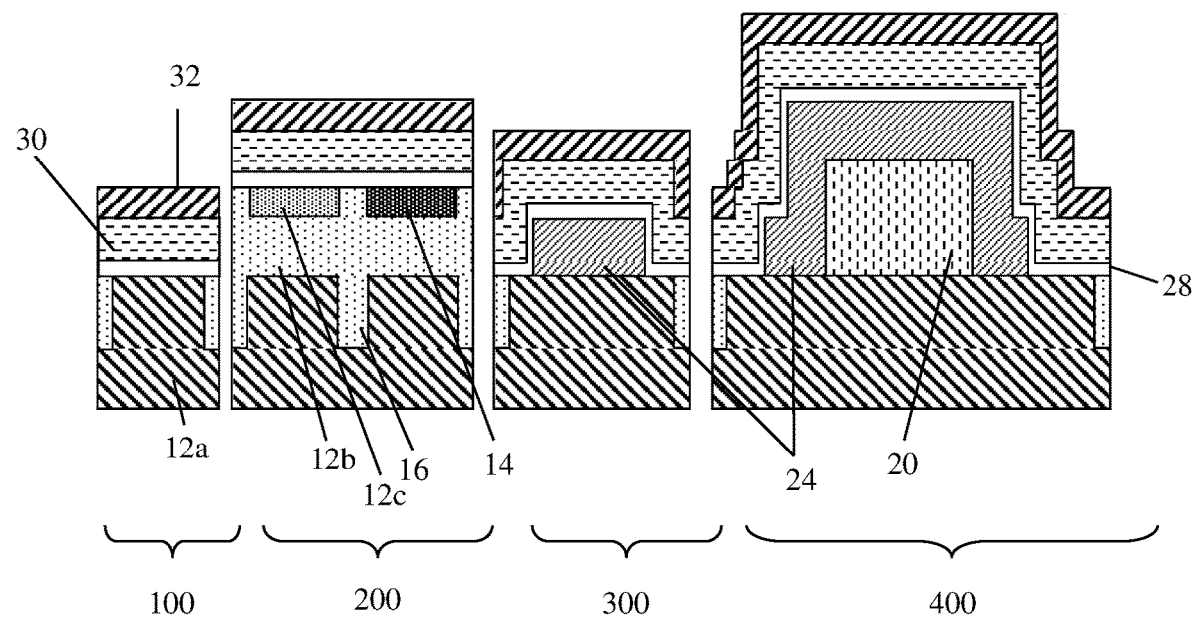
FIG. 6 shows gate materials on the SOI technology and bulk technology for gate formation, amongst other features, and respective fabrication processes in accordance with aspects of the present disclosure.

In FIG. 6, the gate patterning process begins for the hybrid devices, SOI devices, MV FET devices and HV FET devices in each of the regions. Advantageously, each of the gate materials can be fabricated for each of the devices in a same processing step. By way of example, a gate dielectric material 28 is deposited over the insulator material 22 for the MV FET devices and HV FET device, while also being deposited over the semiconductor material 12c, 14 for the hybrid devices and SOI devices. In embodiments, the gate dielectric material 28 can be a high-k dielectric material, e.g., $HfO_2$ $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

Still referring to FIG. 6, a gate conductor material 30 is deposited on the gate dielectric material 28. In embodiments, the gate conductor material 30 can include, for a gate first, a workfunction metal as is understood by those of skill in the art with an optional Si layer on top that can later be silicided. Examples of workfunction materials for a p-channel FET include Ti, TiAlC, Al, TiAl, TaN, TaAlC, TiN, TiC and Co. Examples of the workfunction materials for an n-channel FET include TiN, TaN, TaAlC, TiC, TiAl, TaC, Co, Al, TiAl, HfTi, TiSi, TaSi or TiAlC. The workfunction materials may be formed by CVD, PVD including sputtering, atomic layer deposition (ALD) or other suitable method. A capping material (e.g., SiN) 32 is deposited on the gate conductor material 30 using any conventional deposition method. As should be understood by those of skill in the art, the capping material 32 will be used as sidewall spacers.

Figure 7:
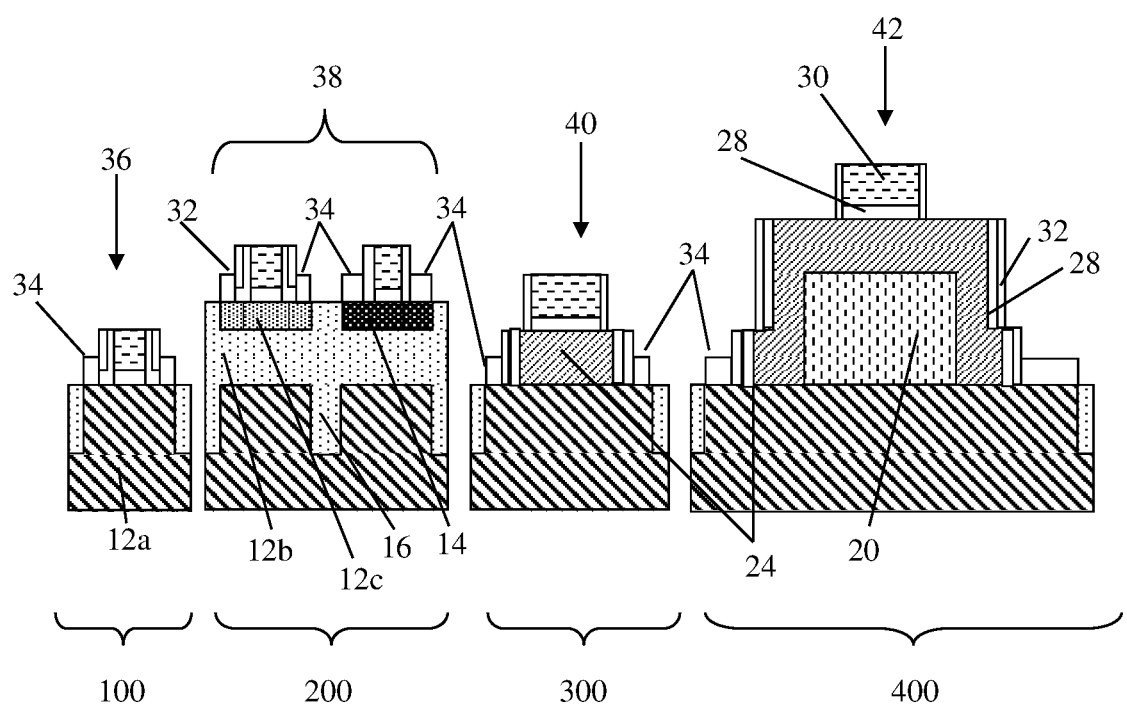
FIG. 7 shows patterned gate materials on the SOI technology and bulk technology, amongst other features, and respective fabrication processes in accordance with aspects of the present disclosure.

In FIG. 7, the gate structures will undergo a patterning process to form, e.g., hybrid devices 36, SOI devices 38, MV FET devices 40 and HV FET 42. For example, the capping material 32, gate conductor material 30 and gate dielectric material 28 are removed from horizontal surfaces of the devices, exposing the semiconductor materials 12a 12c, 14. In this gate patterning process, capping material 32 will remain on the sidewalls of each of the devices 36, 38, 40, 42, after the gate patterning process. This patterning process will define the devices 36, 38, 40, 42.

After defining each of the devices 36, 38, 40, 42, source and drain regions 34 are formed on the exposed semiconductor materials 12a 12c, 14. In embodiments, the source and drain regions 34 are raised source and drain regions formed by doped epitaxial growth processes directly on the respective exposed semiconductor materials 12a (for the hybrid devices 36, MV FET devices 40 and HV FET devices 42) and the semiconductor materials 12c, 14 (for the SOI devices 38). The capping material 32 is then removed to expose the gate conductor material 20.

As further shown in FIG. 8, a liner 43 is deposited over the capping material 32, exposed conductor material 20, and the source and drain regions 34. In embodiments, the liner is a silicide blocking material that will prevent silicide from forming on the top surface of the source and drain regions 34. After partially removal of the liner 43 to exposed the conductor material 20 and the sides of the source and drain regions 34, silicide 44 is formed on the exposed conductor material 20, and the source and drain regions 34. As should be understood by those of skill in the art, the silicide process begins with deposition of a thin transition metal layer, e.g., nickel, cobalt or titanium, over fully formed and patterned semiconductor devices (e.g., doped or ion implanted source and drain regions and respective devices). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts 44 in the active regions of the device. It should be understood by those of skill in the art that silicide contacts will not be required on the devices, when a gate structure is composed of a metal material.

A liner 46 is deposited over each of the devices 36, 38, 40, 42, in addition to the source and drain regions 34. In embodiments, the liner 46 can be a tensile stress liner composed of tensile material, e.g., nitride. An interlevel dielectric material 48 is deposited over the devices by a CVD deposition, followed by a CMP process. Although not shown in this view, contacts are formed to the devices 36, 38, 40, 42, and the source and drain regions 34 using conventional lithography, etching and deposition processes, as is known to those of skill in the art such that no further explanation is required for a complete understanding of the present disclosure.

It is further shown in FIG. 8 that each of the devices 36, 38, 40 and 42 are of different absolute heights. This is due to the different materials and fabrication processes of building these different devices. For example, the device 42 includes two layers of gate oxide material 20, 24; whereas, the device 40 includes one layer of the gate oxide material 20, and device 36 does not include any of the gate oxide. Also, the devices 38 are built on the SOI wafer 12 (e.g., semiconductor material 12a, 14), without the use of the gate oxide material; whereas, the devices 36, 40, 42 are built on the bulk wafers.

The devices described herein can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a substrate having a semiconductor on insulator (SOI) region and a bulk region; and
   a first device formed on the bulk region, the first device having a first gate dielectric layer and a second gate dielectric layer surrounding the first gate dielectric layer, and a thickness of the first gate dielectric layer and the second gate dielectric layer being equal to or greater than a thickness of an insulator layer of the SOI region; and
   two spacers on sides of the first device including over the first gate dielectric layer and the second gate dielectric layer.

2. The structure of claim 1, further comprising a second device formed on the bulk region which has a different absolute height than the first device.

3. The structure of claim 2, wherein the first device is a high voltage field effect transistor (FET).

4. The structure of claim 3, wherein semiconductor material of the SOI region and of the bulk region comprise identical semiconductor material.

5. The structure of claim 2, wherein the second gate dielectric layer, on sides on a side of the first device, comprises a stepped pattern.

6. The structure of claim 1, further comprising a raised source and drain region on sides of the first device and which include silicide on side surfaces thereof.

7. The structure of claim 1, further comprising a second device on the bulk region, the second device including a gate dielectric layer from a same material as the second gate dielectric layer and having a same thickness as the second gate dielectric layer.

8. The structure of claim 1, further comprising a first SOI device and a second SOI device on the SOI region, each being on a different semiconductor material of the SOI region and each comprising a raised source and drain region which is silicided on a side thereof.

9. The structure of claim 8, further comprising another device formed on the bulk region, the other device being devoid of the first gate dielectric layer and the second gate dielectric layer, and sharing a same high-k dielectric material and stress liner that is used for the first device, the second device, the first SOI device and the second SOI device.

10. A structure comprising: a substrate having a semiconductor on insulator (SOI) region and a bulk region;
   a first device formed on the bulk region, the first device having a first gate dielectric layer and a second gate dielectric layer surrounding the first dielectric layer;
   a second device formed on the bulk region, the second device having a gate dielectric layer from a same material as the second gate dielectric layer and having a same thickness; and
   a third device formed on the bulk region, the third device having a different absolute height than the first device and the second device, and the third device being devoid of the first gate dielectric layer and the second gate dielectric layer,
   wherein the first device and the second device are of different absolute heights.

11. The structure of claim 10, wherein a thickness of the first gate dielectric layer and the second gate dielectric layer is greater than a thickness of an insulator layer of the SOI region.

12. The structure of claim 10, wherein the first device is a high voltage field effect transistor (FET) and the second device is a medium voltage FET.

13. The structure of claim 10, further comprising raised source and drain regions for the first device and the second device, and a silicide on side surfaces thereof.

14. The structure of claim 13, further comprising a first SOI device and a second SOI device in the SOI region, the first and second SOI devices being devoid of the first gate dielectric layer and the second gate dielectric layer and each of which are provided over different semiconductor material of the SOI region and the first SOI device and the second SOI device are of a different height than the first device and the second device.

15. The structure of claim 13, wherein the first SOI device and the second SOI device in the SOI region have raised source and drain regions, with a silicide on a side surface thereof.

16. A structure comprising:
   a substrate having a semiconductor on insulator (SOI) region and a bulk region;
   a first device on the bulk region, the first device having a first gate dielectric material and a second gate dielectric material surrounding the first dielectric material;
   a second device formed on the bulk region, the second device having a same gate dielectric material as the second gate dielectric;
   a third device formed on the SOI region, which is devoid of the first gate dielectric material and the second gate dielectric material; and
   a fourth device formed on the SOI region, wherein the first device, the second device, third device, and the fourth device each have source and drain regions which are silicided on a side surface thereof, and
   the third device and the fourth device comprise different semiconductor material of the SOI region, wherein the first gate dielectric material and the second gate dielectric material have a combined thickness greater than a thickness of a buried insulator of the SOI region,
   the semiconductor material of the fourth device in the SOI region comprises a condensed semiconductor material,
   the semiconductor material of the third device in the SOI region comprises a semiconductor material devoid of a condensation material,
   a same stress liner is provided over the first device, second device, third device and fourth device, and
   the first device, second device, third device and fourth device share a same high-k dielectric material.

17. The structure of claim 16, wherein the first device is a high voltage device and the second device is a medium voltage device.

* * * * *